United States Patent
Bhakta et al.

(10) Patent No.: US 6,813,111 B2
(45) Date of Patent: Nov. 2, 2004

(54) IMPLEMENTATION METHOD OF DIGITAL PHASE-LOCKED LOOP

(75) Inventors: Bhavesh G. Bhakta, Plano, TX (US); Younggyun Kim, Irvine, CA (US)

(73) Assignee: Texas Instruments Incorporated, Dallas, TX (US)

( * ) Notice: Subject to any disclaimer, the term of this patent is extended or adjusted under 35 U.S.C. 154(b) by 371 days.

(21) Appl. No.: 09/991,599

(22) Filed: Nov. 21, 2001

(65) Prior Publication Data

US 2002/0080516 A1 Jun. 27, 2002

Related U.S. Application Data

(60) Provisional application No. 60/252,961, filed on Nov. 24, 2000.

(51) Int. Cl.[7] .............................................. G11B 5/596
(52) U.S. Cl. ..................................... 360/77.02; 360/46
(58) Field of Search ............................... 360/31, 39, 46, 360/69.39, 77.02; 331/4, 1 A; 315/376; 327/175

(56) References Cited

U.S. PATENT DOCUMENTS

| | | | | |
|---|---|---|---|---|
| 4,200,845 A | * | 4/1980 | Mendenhall et al. | ........ 331/1 A |
| 4,808,884 A | * | 2/1989 | Hull et al. | ................... 375/376 |
| 5,142,246 A | * | 8/1992 | Petersson | ..................... 331/11 |
| 5,243,605 A | | 9/1993 | Lekmine et al. | |
| 5,278,703 A | | 1/1994 | Rub et al. | |
| 5,321,559 A | | 6/1994 | Nguyen et al. | |
| 5,485,472 A | | 1/1996 | Fredrickson | |
| 5,731,768 A | | 3/1998 | Tsang | |
| 5,745,315 A | | 4/1998 | Aoyama | |
| 5,771,127 A | | 6/1998 | Reed et al. | |
| 5,790,611 A | | 8/1998 | Huang et al. | |
| 5,936,558 A | | 8/1999 | Shafiee et al. | |
| 5,937,020 A | * | 8/1999 | Hase et al. | .................. 375/376 |
| 6,292,322 B1 | * | 9/2001 | Haraguchi | .................... 360/69 |
| 6,356,129 B1 | * | 3/2002 | O'Brien et al. | ............. 327/175 |
| 6,606,365 B1 | * | 8/2003 | Chen | .......................... 375/376 |

OTHER PUBLICATIONS

F. Dolivo et al, "Fast Timing Recovery for Partial–Response Signaling Systems", IEEE, 1989, pp. 0573–0577.
Takushi Nishiya et al, "Turbo–EEPRML: An EEPRML4 Channel with an Error–Correcting Post–Processor Designed for 16/17 Rate Quasi—MTR Code", IEEE, 1998, pp. 2706–2711.
Hamid Shafiee et al, "Low Complexity Viterbi Detection for a Family of Partial Response Systems" IEEE Transactions on Magnetics, vol. 28, No. 5, Sep. 1992, pp. 2892–2894.
Jaekyun Moon et al, "Performance Comparison of Detection Methods in Magnetic Recording" IEEE Transactions on Magnetics, vol. 26, No. 6, Nov. 1990, pp. 3155–3172.
Jan W. M. Bergmans et al, "On the Performance of Data Receivers with a Restricted Detection Delay", IEEE Transactions on Communications, vol. 42, No. 6 Jun. 1994, pp. 2315–2324.
Younggyun Kim et al, "Delay–Constrained Asymtotically Optimal Detection Using Signal–Space Partioning" IEEE, 1998, pp. 573–577.

* cited by examiner

Primary Examiner—David Hudspeth
Assistant Examiner—K. Wong
(74) Attorney, Agent, or Firm—W. Daniel Swayze, Jr.; W. James Brady; Frederick J. Telecky, Jr.

(57) ABSTRACT

A phase lock loop to control phase error including a first phase error detector to detect the phase error in a first mode, a first loop filter to filter a first phase error by using a first factor, a second phase error detector to detect a second phase error in a second mode, a second loop filter to filter a second phase error by using a second factor, and a circuit to select either the first phase error or the second phase error in accordance with the first or second mode.

2 Claims, 2 Drawing Sheets

IMPLEMENTATION METHOD OF DIGITAL PHASE-LOCKED LOOP

This application claims priority under 35 USC §119(e)(1) of provisional application Ser. No. 60/252,961, filed Nov. 24, 2000.

FIELD OF THE INVENTION

The present invention relates to digital systems and, more particularly, to a method and apparatus for incrementally adjusting the phase of a digital signal.

BACKGROUND OF THE INVENTION

Computers and other digital electronic products generally include semiconductor integrated circuits. Present-day integrated circuits may contain millions of transistors and be configured, for example, as a central processing unit (CPU), arithmetic logic unit (ALU), random access memory (RAM), programmable logic array (PLA), application specific integrated circuit (ASIC), or digital signal processor (DSP). Both the sophistication and speed of operation of these integrated circuits has rapidly increased because of improvements in integrated circuit manufacturing technologies resulting in smaller and faster devices.

Digital systems, having these semiconductor integrated circuits, have digital signals such as clock signals to process data, control circuit timing and setup, and for data communication synchronization. A clock signal has a period waveform and normally has a constant frequency. Clock signals or "clocks" may be used throughout a digital system including many integrated circuits. A very large integrated circuit may have multiple clock circuits that drive various circuits therein. These multiple clock circuits may be used for ease in clock signal distribution within the integrated circuit or for specific circuit functions requiring isolated or controllable clock signals.

Clock distribution within an integrated circuit requires precise phase correlation. This is to insure that there is proper setup and processing of the digital information within the integrated circuit. The timing requirements of multiple integrated circuits of a digital system also require equally precise phase correlation. Reliable operation of the integrated circuit depends upon data being stable when a clock signal is received. If a clock signal is out of phase, then the data may no longer be valid. This is also true when transferring signals between multiple integrated circuits.

A typical read channel includes the data head, preconditioning logic (such as preamplification circuitry and filtering circuitry), a data detector and recovery circuit, and error detection and correction circuitry. The read channel is typically implemented in a drive controller associated with the disk drive.

Digital phase-locked loops (DPLL) are typically adopted for magnetic recording channels to accurately extract sampling time for digital signal processing. Typically, the DPLL operates in two different modes, phase and frequency lock-in (acquisition mode) for determining the preamble of data, and tracking slow phase and frequency variation of the incoming signal (tracking mode) to process user data pre-recorded on the disk. Most disk drive applications require a fast acquisition mode. In order to achieve this, a known data sequence, referred to as a preamble, can be recorded on the magnetic medium for this fast acquisition mode.

A second order digital PLL is shown in FIG. 1. A phase error detector (PED) 100 estimates the timing phase error of the sampled signal when used in conjunction with the preamble in the acquisition mode or estimates the timing phase error from decisions from a channel symbol detector 102 in the tracking mode. A first order loop filter 104, which results in the second order loop, has two variable parameters, namely the proportional ($k_p$) and the integral ($k_i$) path gains. These proportional and integral gains control the tracking capability of the loop to phase variation of the incoming signal. This is based on the concept that known signals can be processed faster than unknown signals. The voltage controlled oscillator (VCO) 106 is implemented by an accumulator. The sampler phase is updated according to the VCO output and illustrated as a switch 108.

In the acquisition mode, large gains for the low-pass filter are used for fast phase/frequency lock-in. In contrast, in the tracking mode, smaller gains are used for tracking rather slow variations in the phase and frequency of incoming signals. If a single low-frequency filter is implemented in hardware for both acquisition and tracking modes, which of course uses only one set of gain values, gain resolution, which is the number of different gain values to be set, should be increased. This increase in gain resolution correspondingly requires bit resolution to be changed. The required bit resolution for implementation would also be different for the two modes. The low-pass filter would require a large number of bits for each signal representation in order to effectively achieve high resolution. However, as a result, this implementation with high resolution of a low-pass filter may slow the hardware down by increasing the length of the signal critical path. As signal speeds increase for high-speed applications, this level of complexity and corresponding increase in processing time effectively restricts the speed and limits the application.

SUMMARY OF THE INVENTION

The present invention employs a dedicated loop filter for the acquisition mode and, in addition, uses a second dedicated loop filter for use in the tracking mode. The output of both loop filters are input to a voltage controlled oscillator. As a consequence, two paths for the signal are formed in parallel. Additionally, the output from the acquisition mode low-pass filter is input into the tracking mode low-pass filter.

DETAILED DESCRIPTION OF THE PRESENT INVENTION

The following invention is described with reference to figures in which similar or the same numbers represent the same or similar elements. While the invention is described in terms for achieving the invention's objectives, it can be appreciated by those skilled in the art that variations may be accomplished in view of these teachings without deviation from the spirit or scope of the invention.

Figure 4:
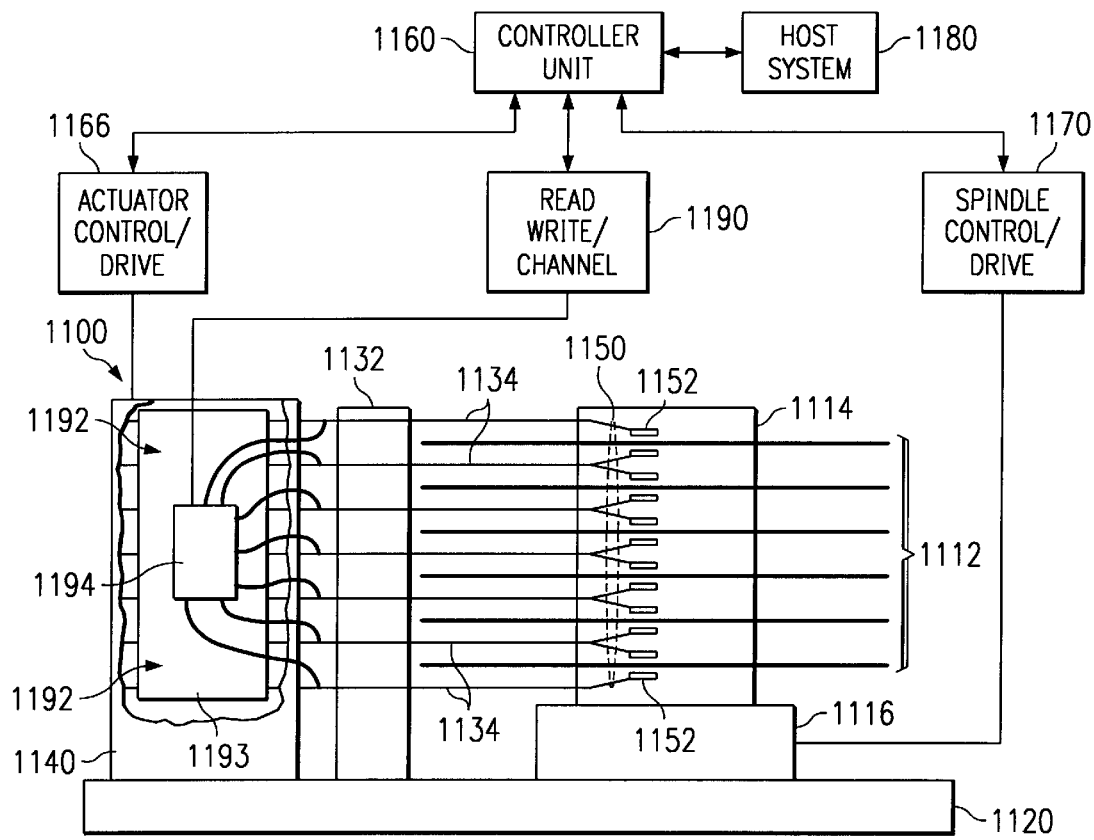
FIG. 4 is a side view of a disk drive system.
Figure 5:
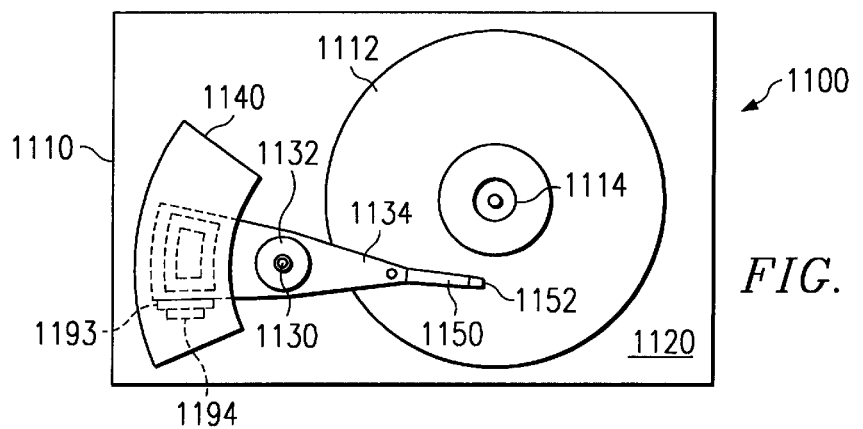
FIG. 5 is a top view of a disk drive system.

FIGS. 4 and 5 show a side and top view, respectively, of the disk drive system designated by the general reference 1100 within an enclosure 1110. The disk drive system 1100 includes a plurality of stacked magnetic recording disks 1112 mounted to a spindle 1114. The disks 1112 may be conventional particulate or thin film recording disk or, in other embodiments, they may be liquid-bearing disks. The spindle 1114 is attached to a spindle motor 1116 which rotates the spindle 1114 and disks 1112. A chassis 1120 is connected to the enclosure 1110, providing stable mechanical support for the disk drive system. The spindle motor 1116 and the actuator shaft 1130 are attached to the chassis 1120. A hub assembly 1132 rotates about the actuator shaft 1130 and supports a plurality of actuator arms 1134. The stack of actuator arms 1134 is sometimes referred to as a "comb." A rotary voice coil motor 1140 is attached to chassis 1120 and to a rear portion of the actuator arms 1134.

A plurality of head suspension assemblies 1150 are attached to the actuator arms 1134. A plurality of inductive transducer heads 1152 are attached respectively to the suspension assemblies 1150, each head 1152 including at least one inductive write element. In addition thereto, each head 1152 may also include an inductive read element or a MR (magneto-resistive) read element. The heads 1152 are positioned proximate to the disks 1112 by the suspension assemblies 1150 so that during operation, the heads are in electromagnetic communication with the disks 1112. The rotary voice coil motor 1140 rotates the actuator arms 1134 about the actuator shaft 1130 in order to move the head suspension assemblies 1150 to the desired radial position on disks 1112.

A controller unit 1160 provides overall control to the disk drive system 1100, including rotation control of the disks 1112 and position control of the heads 1152. The controller unit 1160 typically includes (not shown) a central processing unit (CPU), a memory unit and other digital circuitry, although it should be apparent that these aspects could also be enabled as hardware logic by one skilled in the computer arts. Controller unit 1160 is connected to the actuator control/drive unit 1166 which is in turn connected to the rotary voice coil motor 1140. A host system 1180, typically a computer system or personal computer (PC), is connected to the controller unit 1160. The host system 1180 may send digital data to the controller unit 1160 to be stored on the disks, or it may request that digital data at a specified location be read from the disks 1112 and sent back to the host system 1180. A read/write channel 1190 is coupled to receive and condition read and write signals generated by the controller unit 1160 and communicate them to an arm electronics (AE) unit shown generally at 1192 through a cut-away portion of the voice coil motor 1140. The read/write channel 1190 includes the phase lock loop of the present invention. The AE unit 1192 includes a printed circuit board 1193, or a flexible carrier, mounted on the actuator arms 1134 or in close proximity thereto, and an AE module 1194 mounted on the printed circuit board 1193 or carrier that comprises circuitry preferably implemented in an integrated circuit (IC) chip including read drivers, write drivers, and associated control circuitry. The AE module 1194 is coupled via connections in the printed circuit board to the read/write channel 1190 and also to each read head and each write head in the plurality of heads 1152.

Figure 1:
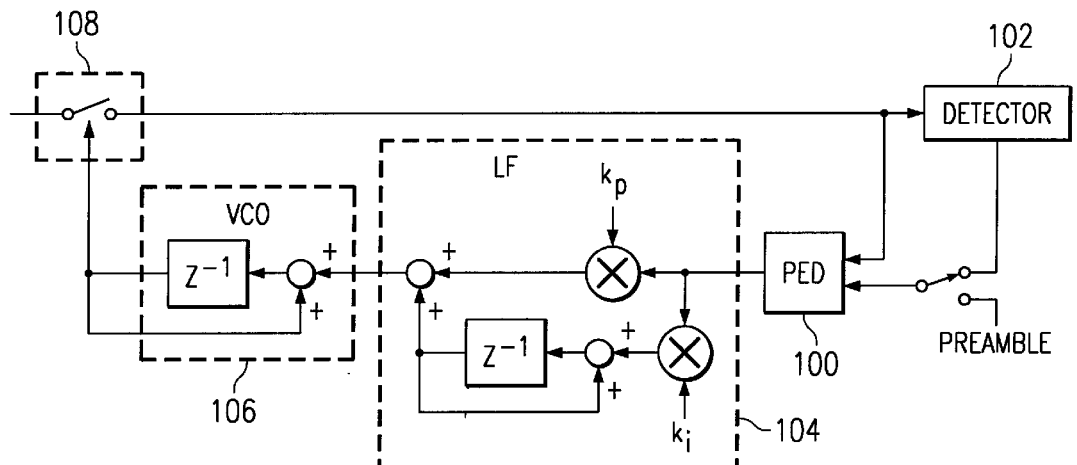
FIG. 1 illustrates a phase-locked loop circuit.
Figure 2:
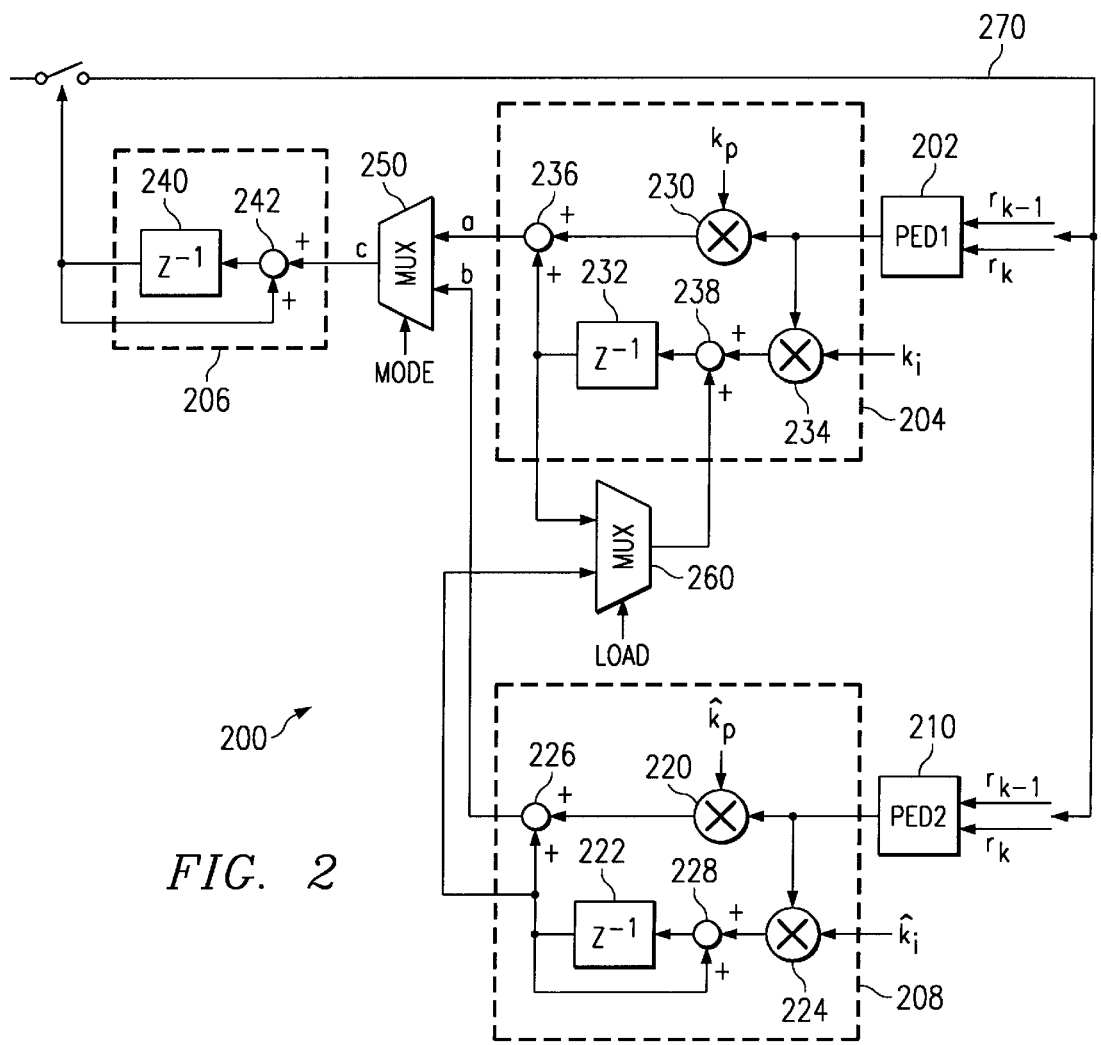
FIG. 2 illustrates a phase-locked loop circuit in accordance with the present invention.

FIG. 2 illustrates phase lock loop 200 of the present invention. A phase error detector 202 is connected to loop filter 204. The loop filter 204 is in turn connected to voltage controlled oscillator 206. Additionally, connected in parallel to first phase error detector 202 and first loop filter 204 is a second phase error detector 210 and loop filter 208. The first phase error detector 202 and first loop filter 204 are used for tracking mode. The first phase error detector 202 and the first loop filter 204 operate during tracking where user data from the disk is being read and input to phase error detector 202. During acquisition, when data is being looked for or particularly when the preamble is being read, the second phase error detector 210 and the second loop filter 208 process the samples, looking for the preamble. Since the preamble is a predetermined sequence of bits, these bits of the preamble are easily recognizable by the phase error detector 210 and, consequently, the time required to reach a decision with the second phase error detector 210 as to whether or not the preamble is a valid preamble is relatively short. The gains for loop filter 208 are significantly higher than for loop filter 204. Since the samples received by the first phase error detector 202 are user data and, in a sense, completely random, a longer time is required for a decision to be made. The first phase error detector 202 includes an output connected to multiplying circuits 230 and 234. The output of multiplying circuit 230 is connected to summing circuit 236. The output of multiplying circuit 234 is connected to summing circuit 238. The output of summing circuit 238 is connected to delay circuit 232 which delays the output signal in the Z domain. The output of delay circuit 232 is connected to summing circuit 236. Additionally, the output of delay circuit 232 is connected to mux circuit 260. The output of mux circuit 260 is connected to summing circuit 238.

The output of second phase error detector 210 is connected to multiplier circuit 220 and multiplier circuit 224. The output of multiplier circuit 220 is connected to summing circuit 226. The output of multiplying circuit 224 is connected to summing circuit 228. The output of summing circuit 228 is connected to delay circuit 222, which delays the output signal of the delay circuit 222 in the Z domain. The output of delay circuit 222 is connected to summing circuit 226. Additionally, the output of delay circuit 222 is connected to summing circuit 228. The output of summing circuit 236 and the output of summing circuit 226 is input to mux circuit 250. The output of mux circuit 250 is connected to summing circuit 242. Summing circuit 242 and delay circuit 240 are a portion of the VCO 206. The output of summing circuit 242 is connected to delay circuit 240, which delays the output of summing circuit 242 in the Z domain. The output of delay circuit 240 is connected to summing circuit 242. The mux circuit 250 is controlled by the mode signal which alternates between an acquisition mode signal to indicate the acquisition mode and a tracking mode signal to indicate the tracking mode. While in the acquisition mode, the output signal from summing circuit 226 is selected to be input to summing circuit 242. While in the tracking mode, the output of summing circuit 236 is input to mux 252 and output to summing circuit 242.

During tracking operations, samples, including a current sample and a time-delayed sample, are input to first phase error detector 202. The output of phase error detector 202 outputs a first phase error estimate signal to estimate the phase error between the current sample and the delayed sample. The first phase error estimate signal is input both to multiplier 230 and multiplier 234. The multiplier circuit 230 multiplies the first phase error estimate signal by the proportional constant $k_p$. The output of multiplier circuit 230 is a first multiplied signal. Likewise, with multiplier 234, the first phase error estimate signal is multiplied by integral gain $k_i$. The output of multiplier circuit 234 is a second multiplied signal. Either the output from the loop filter 204, namely the first loop filter signal, is input to summing circuit 238, or the output from loop filter 208, the second loop filter signal, is input to summing circuit 238 based upon the load signal to control mux circuit 260. The second multiplied signal is summed in summing circuit 238. The summing circuit 238 outputs a second summed signal to delay circuit 232. The delay circuit 232 delays the second summed signal to output a first delayed signal. The first delayed signal is input to summing circuit 236. The first delayed signal is additionally input to mux 260.

During acquisition, the samples, $r_{k-1}$ and $r_k$, which may represent the preamble, are input to phase error detector 210. The phase error detector 210 outputs a second phase error estimate signal to multiplying circuits 220 and 224 to estimate the phase error between $r_k$ and $r_{k-1}$. The multiplying circuit 220 multiplies the second phase error estimate signal by the proportional gain $\hat{k}_p$ to output a third multiplied signal from the multiplier 220 and is input to summing circuit 226. In a similar fashion, the multiplier circuit 224 multiplies the second phase error estimate signal by the integral gain $\hat{k}_i$. The output of multiplier 224 outputs a fourth multiplied signal and is input to summing circuit 228. Summing circuit 228 sums the output of delay circuit 222 and the fourth multiplied signal and outputs a third summed signal. The third summed signal is input to delay circuit 222 which delays the third summed signal to output a delayed third summed signal. The delayed third summed signal is input to summing circuit 228 as well as summing circuit 226. Additionally, the delayed third summed signal is input to multiplex 260. The output from summing circuit 226 is input to multiplex circuit 250. The multiplex circuit 250 and the multiplex circuit 260 are controlled by a mode signal and load signal, respectively, which correspond to the mode which is either acquisition or tracking. The output of the multiplex signal 250 is input to voltage controlled oscillator 206 including the summing circuit 242 of voltage controlled oscillator 206. The output of summing circuit 242 is input to delay circuit 240. The output of delayed circuit 240, which is a delayed fourth summing signal, is input to summing circuit 242 and output to input line 270. The difference between loop filter 204 and loop filter 208 is the relative proportional and integral gains with respect to one another. At the end of the acquisition mode, the output of the loop filter 208 is input to summing circuit 238 for a tracking mode as an estimate of frequency offset.

Figure 3:
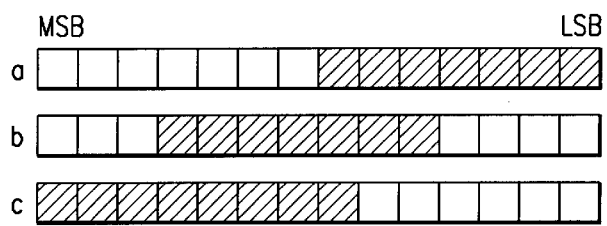
FIG. 3 illustrates bit alignment of signals.

FIG. 3 illustrates the required bit resolution for signals a, b and c in FIG. 2 and that signal values for fast lock-in and slow tracking are in different ranges, fast lock-in meaning acquisition. Each rectangle represents a single bit. The required bit position for each signal is marked in shade. The fast acquisition is achieved by using larger gains for loop filters and those in the tracking mode. The output from delay circuit 222 and 232 is frequency error. In one embodiment, different phase error detectors are used for phase error detector circuit 202 and phase error detector 210. The fast acquisition usually required in the acquisition mode is achieved using larger gains for the loop filter 208 than for the loop filter 204. The bit alignment in FIG. 3 indicates different value ranges for the output from the loop filter for acquisition and tracking modes. In one embodiment, as shown in FIG. 2, the bit resolution for signals a and b are the same, for example 7 bits. This is a significant reduction in the number of bits required for a conventional structure which may require as many as 11 bits. The reduction in bit resolution results in different hardware complexity and signal critical path. For example, the size of the adder 226 and 236 is smaller than a conventional circuit. Correspondingly, the signal critical path of the adder is shorter than a conventional adder.

When used in a digital implementation, the gain values for the low-pass filter should be quantized. For an analog implementation of the low-pass filter, the gain values need not be quantized. The complexity of multipliers in the low-pass filter varies according to the gain resolution, for example, the number of different quantization levels. Since the gain values for acquisition and tracking modes are significantly different, gain resolution should be defined separately for each mode, which would double the required gain resolution. The larger gain resolution increases hardware complexity in implementation and then increases the signal critical path. For high-speed applications, using two separate low-pass filters, as illustrated in FIG. 2 as loop filter 204 and loop filter 208, results in lower hardware complexity and increased operating speed.

What is claimed is:

1. A phase lock loop to control phase error, including:
   a first phase error detector to detect the phase error in a first mode;
   a first digital loop filter to filter a first phase error by using a first factor;
   a second phase error detector to detect a second phase error in a second mode;
   a second digital loop filter to filter a second phase error by using a second factor; and
   a circuit to select either said first phase error or said second phase error in accordance with said first or second mode,
   wherein said first mode corresponds to tracking, and
   wherein said second mode corresponds to acquisition.

2. A phase lock loop as in claim 1, wherein said first loop filter receives an input from said second loop filter.

* * * * *